United States Patent
Tang et al.

(10) Patent No.: US 9,473,148 B2
(45) Date of Patent: Oct. 18, 2016

(54) METHOD FOR COMPENSATING LOCAL OSCILLATOR FREQUENCY

(71) Applicant: Semiconductor Manufacturing International (Shanghai) Corporation, Shanghai (CN)

(72) Inventors: Hua Tang, Shanghai (CN); Fei Liu, Shanghai (CN); Benpeng Xun, Shanghai (CN)

(73) Assignee: Semiconductor Manufacturing International (Shanghai) Corporation, Shanghai (CN)

(*) Notice: Subject to any disclaimer, the term of this patent is extended or adjusted under 35 U.S.C. 154(b) by 0 days.

(21) Appl. No.: 14/642,694

(22) Filed: Mar. 9, 2015

(65) Prior Publication Data

US 2015/0303928 A1  Oct. 22, 2015

(30) Foreign Application Priority Data

Apr. 22, 2014 (CN) .......................... 2014 1 0163804

(51) Int. Cl.
| | | |
|---|---|---|
| H03L 1/00 | (2006.01) | |
| H03K 3/03 | (2006.01) | |
| H03L 1/02 | (2006.01) | |

(52) U.S. Cl.
CPC ............... *H03L 1/00* (2013.01); *H03K 3/0315* (2013.01); *H03L 1/022* (2013.01)

(58) Field of Classification Search
USPC .................................................... 331/176, 57
See application file for complete search history.

(56) References Cited

U.S. PATENT DOCUMENTS

| | | | | |
|---|---|---|---|---|
| 6,304,148 B1* | 10/2001 | Nomura | ................... | G11C 7/04 326/95 |
| 6,809,603 B1* | 10/2004 | Ho | ....................... | H03K 3/0315 331/175 |
| 2008/0218253 A1* | 9/2008 | Pietri | ...................... | G05F 3/262 327/543 |
| 2012/0056609 A1* | 3/2012 | Satoh | ........................ | G05F 3/30 323/313 |

* cited by examiner

*Primary Examiner* — Joseph Chang
(74) *Attorney, Agent, or Firm* — Kilpatrick Townsend & Stockton LLP

(57) ABSTRACT

An oscillator circuit includes a voltage-controlled oscillator configured to output an AC output signal having a predetermined frequency, which changes due to temperature and fabrication process variations and a control voltage generating circuit configured to provide a voltage signal to the voltage-controlled oscillator to maintain the predetermined frequency by compensating for the temperature and fabrication process variations.

13 Claims, 7 Drawing Sheets

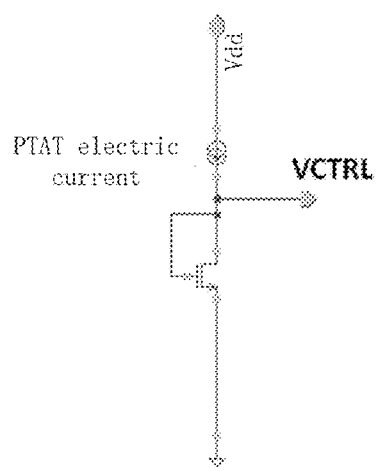
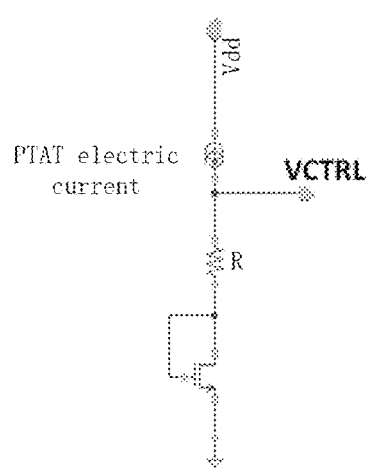
FIG. 6
FIG. 7
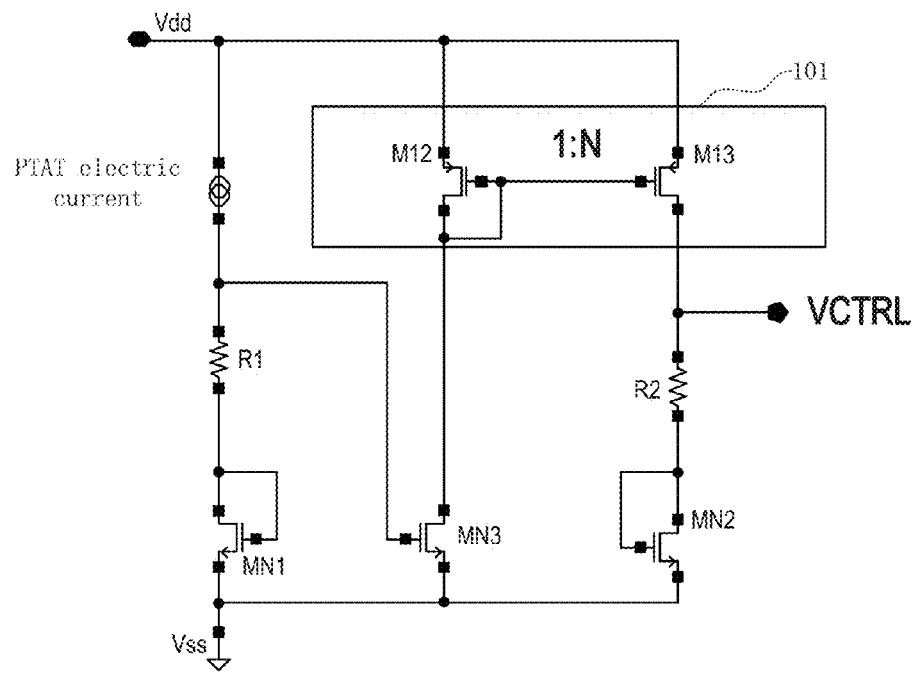
FIG. 8

METHOD FOR COMPENSATING LOCAL OSCILLATOR FREQUENCY

CROSS-REFERENCES TO RELATED APPLICATIONS

This application claims priority to Chinese patent application No. 201410163804.3, filed on Apr. 22, 2014, the content of which is incorporated herein by reference in its entirety.

BACKGROUND OF THE INVENTION

The present invention relates to frequency oscillators, and more particularly to an oscillation circuit having a compensation unit and an electronic device containing such an oscillation circuit.

Frequency oscillators are widely used in analog circuits, mainly for converting DC energy into AC energy. A ring-structured oscillator is the simplest and easiest to implement. FIG. 1 shows a conventional ring oscillator including three or more odd-numbered stages of delay elements. Each of the delay elements introduces a delay and a phase to maintain the desired oscillator frequency.

Since a conventional oscillator is susceptible to temperature and fabrication process variations, the oscillator frequency may deviate more than ±40% from the normal frequency without any compensation scheme. The main factor for the deviation includes the threshold voltage drift, the gate capacitance and other parameters of the transistors (e.g., MOS transistors) due to process variations, changes of carrier mobility and device characteristics due to temperature variations. In addition, various passive devices within the oscillator may vary with the change in processes and in technology.

In order to maintain a stable and accurate oscillator frequency, the conventional approach is to externally trim the oscillator by performing an external calibration in combination with some digital control logic to adjust the oscillator frequency. FIG. 2 is a simplified circuit diagram of an external calibration mode oscillation circuit of the prior art. It can be seen that the conventional approach has several drawbacks. For example, a reference clock and a digital control circuit are required.

The conventional approach without external calibration is not able to meet the required frequency accuracy. Furthermore, an external calibration circuit requires an additional reference clock and digital control circuit that will increase costs and complexity to the oscillator.

Therefore, there is a need for a novel oscillator circuit and an electronic device including the same that provides a stable oscillator frequency across temperature and fabrication process variations.

BRIEF SUMMARY OF THE INVENTION

Embodiments of the present invention relate to frequency oscillators, and more particularly to an oscillation circuit having a compensation unit and an electronic device containing such an oscillation circuit.

According to embodiments of the present invention, an oscillator circuit includes a voltage-controlled oscillator configured to output an AC output signal having a predetermined frequency which changes due to temperature and process variations, and a control voltage generating circuit configured to provide a voltage signal to the voltage-controlled oscillator to maintain the predetermined frequency by compensating for the temperature and process variations.

In one embodiment, the control voltage generating circuit includes an input unit configured to provide a PTAT current and a PTAR current, and a compensation unit configured to generate the voltage signal in response to the PTAT current and the PTAR current.

In one embodiment, the input unit is configured to provide a power supply voltage to the compensation unit.

In one embodiment, the input unit includes a first current mirror circuit and a second current mirror circuit. The first current mirror circuit includes a first p-type transistor and a second p-type transistor for outputting the PTAT current. The second current mirror circuit includes a third p-type transistor and a fourth p-type transistor for outputting the PTAR current. The first current mirror circuit has an output terminal connected to an output terminal of the second current mirror circuit at a node, which is connected to an input of the compensation unit.

In one embodiment, a source of the first p-type transistor, a source of the second p-type transistor, a source of the third p-type transistor, and a source of the fourth p-type transistor are connected to a high voltage level Vdd. A drain of the first p-type transistor and a drain of the third p-type transistor are connected to a low voltage level Vss. A gate of the first p-type transistor, a gate of the second p-type transistor, and the drain of the first p-type transistor are connected together. A drain of the second p-type transistor and a drain of the fourth p-type transistor are connected together at the node. A gate of the third p-type transistor, a gate of the fourth p-type transistor, and the drain of the third p-type transistor are connected together.

In one embodiment, the node is an output terminal of the input unit configured to output the PTAT current and the PTAR current.

In one embodiment, the compensation unit includes a first resistor having a first terminal and a second terminal, the first terminal is connected to a mirrored PTAT current and a mirrored PTAR current. A first n-type transistor has a first terminal and a gate connected together to form a diode, and the first terminal of the first n-type transistor is connected to the second terminal of the first resistor for receiving the mirrored PTAT current and the mirrored PTAR current.

In one embodiment, the compensation unit includes a first resistor having a first terminal connected to a mirrored PTAT current and a mirrored PTAR current and a second terminal, and a second resistor having a first terminal and a second terminal. The compensation unit also includes a first n-type transistor, a second n-type transistor, a third n-type transistor, a fifth p-type transistor, and a sixth p-type transistor. The second terminal of the first resistor is connected to a source of the first n-type transistor, a gate and the source of the first n-type transistor and a gate of the third n-type transistor are connected together. A drain of the first n-type transistor, a drain of the second transistor, and a drain of the third transistor are connected to a low voltage level Vss. A source of the third n-type transistor and a drain and a gate of the fifth p-type transistor are connected together. A source of the fifth p-type transistor and a source of the sixth p-type transistor are connected to a high level voltage Vdd. A gate of the fifth p-type transistor and a gate of the sixth p-type transistor are connected together. A drain of the sixth p-type transistor is connected to the first terminal of the second resistor, and the second terminal of the second resistor and a gate and a source of the second n-type transistor are connected together.

In one embodiment, the fifth p-type transistor and the sixth p-type transistor form a third current mirror circuit.

In one embodiment, a drain of the sixth p-type transistor is an output terminal of the compensation unit configured to output the voltage signal.

In one embodiment, the voltage-controlled oscillator is a ring oscillator. The voltage-controlled oscillator includes an odd number N of delay elements, and N is an integer greater than or equal to three. Each of the delay elements includes an inverter having a p-type transistor, a n-type inverter, and a control transistor connected in series. The control transistor has a source connected to a drain of the n-type transistor, a drain connected to a low voltage level Vss, and a gate connected to the voltage signal.

In one embodiment, the p-type transistor comprises a source connected to a high voltage level Vdd, the inverter of a first delay element comprising an output connect to an input of the inverter of a next delay element, and an output of a last delay element connected to an input of the inverter of the first delay element. The output of the last delay element outputs the AC output signal.

Embodiments of the present invention also provide an electronic device containing the above-described oscillator.

The following description, together with the accompanying drawings, will provide a better understanding of the nature and advantages of the claimed invention.

BRIEF DESCRIPTION OF THE DRAWINGS

The accompanying drawings, which are incorporated in and constitute a part of the specification, illustrate embodiments of the present invention. The like reference labels in various drawings refer to the like elements.

FIG. 6 is a simplified circuit diagram of a control voltage generating circuit according a first exemplary embodiment of the present invention;

FIG. 7 is a simplified circuit diagram of a control voltage generating circuit according a second exemplary embodiment of the present invention;

FIG. 8 is a simplified circuit diagram of a control voltage generating circuit according a third exemplary embodiment of the present invention;

DETAILED DESCRIPTION OF THE INVENTION

The present invention will be understood more fully from the detailed description given below and from the accompanying drawings of the preferred embodiments of the invention, which, however, should not be taken to limit the invention to the specific embodiments, but are for explanation and understanding only.

In the following description, numerous specific details are provided for a more thorough understanding of the present invention. However, it is understood that the present invention may be implemented without one or more of these details. Well-known technical features are not described for reasons of brevity.

Embodiments of the present invention are illustrative and not limiting. Features described with respect to different embodiments may be combined and interchanged, without departing from the scope or spirit of the present invention. Those skilled in the art with access to the present disclosure will recognize that other voltage control circuits and process and temperature compensation circuits can also be designed within the scope of the present invention.

The terms "a", "an" and "the" may include singular and plural references. Furthermore, as used herein, the words "and/or" may refer to and encompass any possible combinations of one or more of the associated listed items. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

The present invention will now be described more fully herein after with reference to the accompanying drawings, in which preferred embodiments of the invention are shown. This invention may, however, be embodied in many different forms and should not be construed as limited by the embodiments set forth herein. Rather, these embodiments are provided so that this disclosure will be thorough and complete, and will fully convey the scope of the invention to those skilled in the art.

Example Embodiment 1

Figure 1:
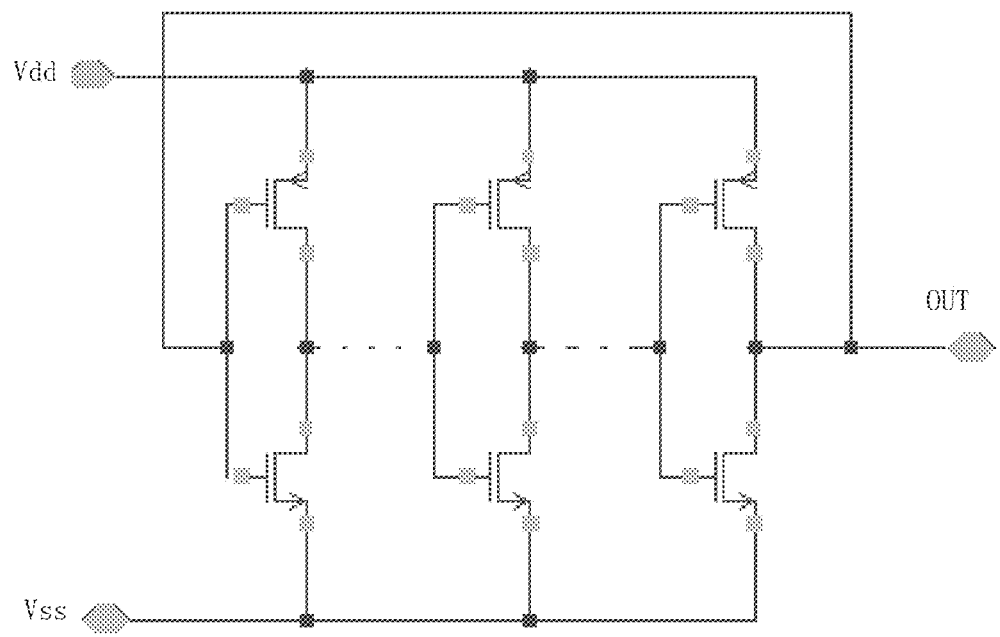
FIG. 1 is a conventional ring oscillator circuit.
Figure 2:
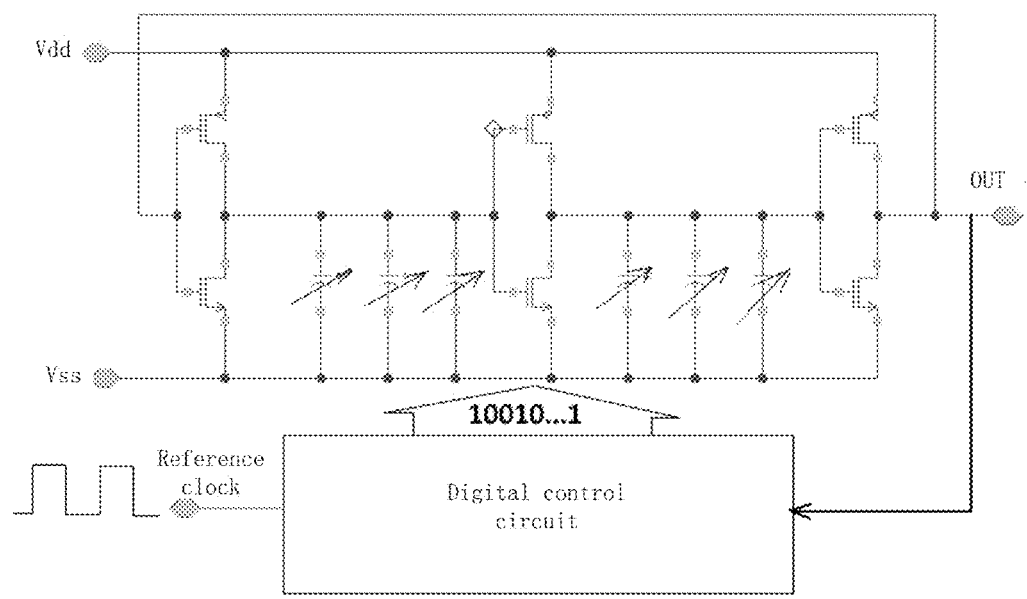
FIG. 2 is a conventional ring oscillator circuit having a reference clock and a digital control circuit.
Figure 3:
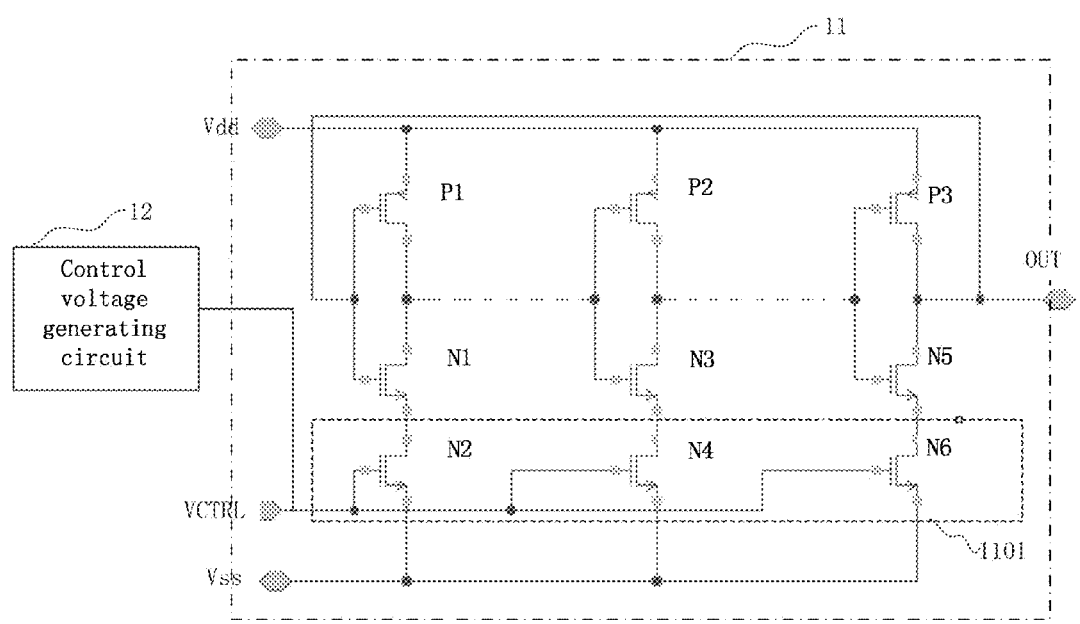
FIG. 3 is a frequency oscillator circuit according to an embodiment of the present invention.

FIG. 3 illustrates a frequency oscillator circuit according to an example embodiment of the present invention. The frequency oscillator circuit is shown as including an oscillator 11 and a control voltage generating circuit 12. Oscillator 11 is configured to provide an electric signal OUT having a predetermined frequency. Control voltage generating circuit 12 is configured to provide a control voltage signal VCTRL to oscillator 11. Specifically, the control voltage signal VCTRL is configured to compensate for temperature and process variations that may affect the predetermined frequency of the signal OUT. In a specific embodiment, oscillator 11 is a voltage-controlled ring oscillator.

Referring to FIG. 3, oscillator 11 is a ring oscillator having an odd-numbered N of delay elements connected in series. N is an integer greater than or equal to 3 (three). The output of the last delay elements is coupled to the input of the first delay element. For clarity, FIG. 3 shows a ring oscillator having three delay elements. A first delay element includes a p-type transistor P1, n-type transistors N1, N2 that are connected in series between a high voltage level Vdd and a low voltage level Vss. A second delay element includes a p-type transistor P2, n-type transistors N3, N4 that are connected in series between the high voltage level Vdd and the low voltage level Vss. A third delay element includes a p-type transistor P3, n-type transistors N5, N6 that are connected in series between the high voltage level Vdd and the low voltage level Vss. The first, second, and third delay elements have a similar structure where the transistors may have the same or different feature sizes.

The transistors N2, N4, and N6 form a voltage control circuit 1101 that is configured to adjust the frequency of the output signal OUT by adjusting the RC time constant of the oscillator 11. The RC constant is adjusted by varying the resistance of the transistors N2, N4, and N6 using the control voltage signal VCTRL.

Although the ring oscillator is shown as a single-ended oscillator, it is understood, however, that the ring oscillator can be a differential-signal oscillator, i.e., the delay elements may include differential inputs and differential outputs.

Figure 4:
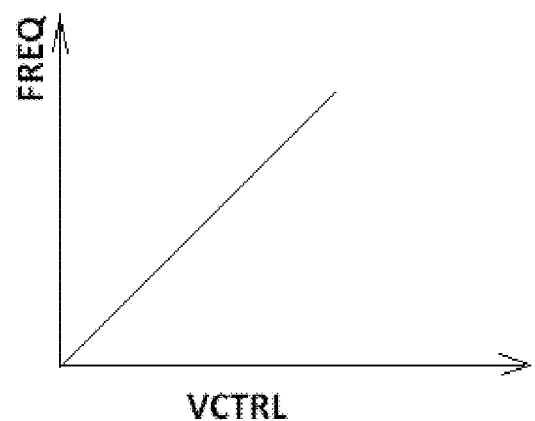
FIG. 4 is a graph illustrating an oscillator frequency as a function of a control voltage.

FIG. 4 is a graph illustrating an oscillator frequency as a function of a control voltage. As shown in FIG. 4, the output oscillator frequency is proportional to the applied control voltage. Therefore, the frequency of an oscillator can be compensated for the temperature and process variations by adjusting the control voltage signal VCTRL.

Figure 5A:
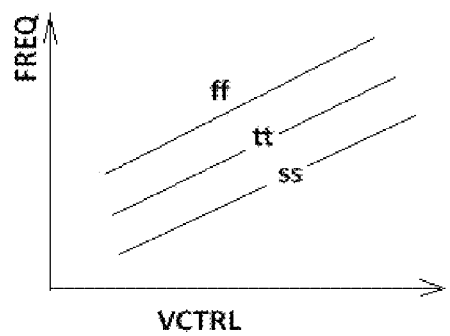
FIG. 5A is a graph illustrating an oscillator frequency as a function of a control voltage.

FIG. 5A is a graph illustrating oscillator frequencies for the process corners as a function of a control voltage. As shown, the oscillator frequencies at process corners fast-fast (denoted "ff"), typical-typical (denoted "tt"), and slow-slow (denoted "ss") are proportional to the control voltage, where the frequency at the fast-fast process corner is defined as Fff, the frequency at the typical-typical process corner is defined as Ftt, and the frequency at the slow-slow process corner is defined as Fss, and Fff, Ftt, and Fss satisfy the relation: Fff>Ftt>Fss.

Figure 5B:
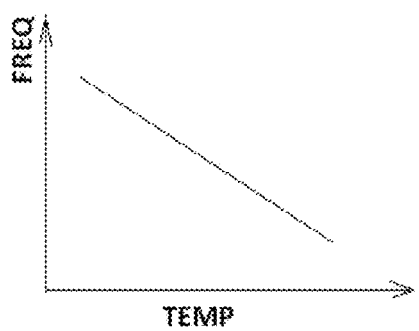
FIG. 5B is a graph illustrating an oscillator frequency as a function of a temperature.

FIG. 5B is a graph illustrating an oscillator frequency as a function of temperature. The oscillator frequency decreases with an increase in temperature due to changes in carrier mobility.

Figure 5C:
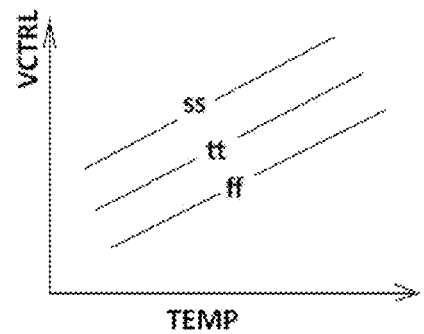
FIG. 5C is a graph illustrating changes in a voltage-controlled oscillator as a function of the control voltage and temperature according an embodiment of the present invention.

By combining the graphs of FIGS. 4, 5A and 5B, the present invention generate a control voltage signal VCTRL, which can compensate for the process and temperature variations. FIG. 5C is a graph illustrating a relation of changes in the process corners frequencies with respect to the control voltage and temperature according an embodiment of the present invention. The negative temperature coefficient of the oscillator frequency of FIG. 5B is compensated by the positive temperature coefficient of the control voltage signal of FIG. 5C.

According to the present invention, a control voltage signal of FIG. 5C can be generated to compensate for the voltage-controlled oscillator. Embodiments of the present invention introduce a temperature sensor and a fabrication process sensor to provide a control voltage signal VCTRL.

FIG. 6 is a simplified circuit diagram of a control voltage generating circuit according a first exemplary embodiment of the present invention. In accordance with the present invention, a proportional-to-absolute-temperature (PTAT) current, i.e., the PTAT current is proportional to the temperature and flows through an n-type transistor (e.g., NMOS transistor) that is configured to be a diode so that the control voltage signal VCTRL=Vgs of the NMOS transistor. The gate-source voltage Vgs of the NMOS transistor can be calculated by the following expression:

$$Vg = \sqrt{(2 \ast Id/\beta)} + Vth \quad (1)$$

where Id is the PTAT current, Vth is the threshold voltage of the NMOS transistor, and $\beta$ is the conductivity of the NMOS transistor.

Since the threshold voltage Vth has the following frequency relationship Fff<Ftt<Fss with respect to process variations, the threshold voltage Vth satisfies the VCTRL requirements of FIG. 5C. The control voltage generating circuit of FIG. 6 thus provides a control voltage signal VCTRL that meets the relation of FIG. 5C.

Since the PTAT current itself is proportional to the resistance of the NMOS transistor, the circuit of FIG. 6 will introduce a resistance change with the process variations, thereby affecting the accuracy of the compensation. FIG. 7 is a simplified circuit diagram of a control voltage generating circuit for compensating for a resistance change on the PTAT current according to an exemplary embodiment of the present invention. The control voltage generating circuit of FIG. 7 introduces a resistor R for compensating for the resistance change of the NMOS transistor. This PTAT current generated by temperature compensated voltages across a resistor R is proportional to absolute resistance (PTAR). However, the resistor R may not completely compensate for the resistance change of the NMOS transistor, an additional circuitry is introduced to compensating for the resistance change, as shown in FIG. 8.

FIG. 8 is a simplified circuit diagram of a control voltage generating circuit according an exemplary embodiment of the present invention. As shown, the control voltage generating circuit includes a current mirror circuit 101 having a current mirror ratio 1:N, where N is a scaling factor. The control voltage generating circuit also includes resistors R1, R2 and transistors MN1, MN2, and MN3. Transistor MN1 has a gate connected to a first terminal, which is connected to a first terminal of resistor R1, and a second terminal connected to Vss. Transistor MN3 has a gate connected to a second terminal of resistor R1, a first terminal connected to a first output of the current mirror circuit 101, and a second terminal connected to Vss. Transistor MN2 has a gate connected to a first terminal, which is connected to a first terminal of resistor R2, and a second terminal connected to Vss. Resistor R2 has a second terminal connected to a second output of the current mirror circuit 101, which provides a control voltage signal VCTRL to compensate for process and temperatures variations of an oscillator, e.g., oscillator 11 in FIG. 3.

Of course, in addition to the control voltage generating circuits shown in FIGS. 6 through 8, other control voltage generating circuits may also be used for the oscillator circuit in accordance with the present invention. It is recognized that modifications may be made from the control voltage generating circuit with the scope of the present invention that is not to be limited to the details disclosed herein as long as the control voltage generating circuit includes a compensation circuit that does not require external calibration to improve the stability of the output frequency of the oscillator.

Figure 9:
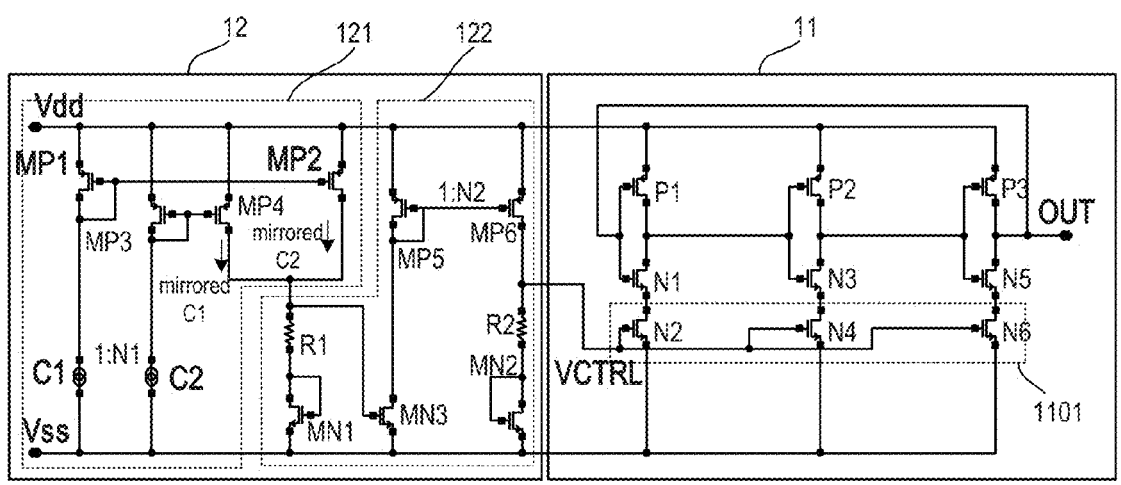
FIG. 9 is a simplified circuit diagram of an oscillation circuit according an embodiment of the present invention.

FIG. 9 is a simplified circuit diagram illustrating an oscillator circuit according to an exemplary embodiment of the present invention. As shown, the oscillator circuit includes an oscillator 11 and a control voltage generating circuit 12. The oscillator 11 may be a ring oscillator, and the control voltage generating circuit 12 is configured to generate a control voltage signal VCTRL used to compensate for process and temperature variations of the oscillator 11.

The oscillator 11 of FIG. 9 is identical to the oscillator 11 of FIG. 3. That is, the oscillator 11 is a ring oscillator having an odd-numbered N of delay elements connected in series, where N is an integer greater than or equal to 3 (three). The output of the last delay elements is coupled to the input of the first delay element. For clarity, oscillator 11 in FIG. 9 is shown as a ring oscillator having three delay elements. The first delay element includes a p-type transistor P1, n-type transistors N1, N2 that are connected in series between a high voltage level Vdd and a low voltage level Vss. A second delay element includes a p-type transistor P2, n-type transistors N3, N4 that are connected in series between the high voltage level Vdd and the low voltage level Vss. A third delay element includes a p-type transistor P3, n-type transistors N5, N6 that are connected in series between the high voltage level Vdd and the low voltage level Vss. The first, second, and third delay elements have a similar or identical structure, however, the transistors may have the same or different feature sizes.

The block 1101 includes transistors N2, N4, and N6 that form a voltage control circuit configured to adjust the RC time constant of the transistors N2, N4, and N6, thereby controlling the frequency of the output signal OUT of the oscillator 11.

The voltage control generating circuit 12 includes an input unit 121 and a compensation unit 122. Input unit 121 is configured to supply an electric current (i.e., a proportional-to-absolute-temperature PTAT and proportional-to-absolute-resistance PTAR current) and voltage supplies (i.e., Vdd, Vss) to compensation unit 122. Compensation unit 122 is configured to generate the control voltage signal VCTRL to compensate for process and temperature variations of oscillator 11.

Input unit 121 includes a first p-type transistor pair MP1 and MP2 and a second p-type transistor pair MP3 and MP4. Referring to FIG. 9, MP1 has a first terminal connected to a high voltage supply Vdd and a gate connected a second terminal. MP2 has a first terminal connected to the high voltage supply Vdd, a gate connected to the gate of MP1, and a second terminal connected to a first terminal of a resistor R1. MP3 has a first terminal connected to the high voltage supply Vdd and a gate connected a second terminal. MP4 has a first terminal connected to the high voltage supply Vdd, a gate connected to the gate of MP3, and a second terminal connected to the first terminal of resistor R1. C1 is the PTAT (proportional-to-absolute-temperature) current and C2 is the PTAR (proportional-to-absolute-resistance) current. The first MP1 and MP2 pair forms a first current mirror circuit to mirror the current C1 (i.e., the PTAT current) in a current mirror ratio of 1:N1 to provide a mirrored PTAT current to compensation unit 122. The second MP3 and MP4 pair forms a second current mirror to mirror the current C2 (i.e., PTAR current) in a current mirror ratio of 1:N1 to provide a mirrored PTAR current to compensation unit 122. The mirrored currents C1 (PTAT) and C2 (PTAR) are connected at a node M to provide the summed current to compensation unit 122 that generates the control voltage signal VCTRL in response to the provided mirrored C1 and C2 currents.

Referring still to FIG. 9, compensation unit 122 includes n-type transistors MN1, MN2, MN3, p-type transistors MP5, MP6, and resistors R1 and R2. Compensation unit 122 provides a second compensation through resistors R1 and R2, the transistors MP5 and MP6 form a current mirror circuit having a mirror ratio of 1:N2, where N2 is a rational number (representing the mirror gain) to produce the desired control signal VCTRL. MP5 has a first terminal connected to the high voltage supply Vdd, and a gate connected to a second terminal. MP6 has a first terminal connected to Vdd, a gate connected to the gate of MN5, and a second terminal connected to a first terminal of resistor R2. Resistor R1 has a second terminal connected to a first terminal of transistor MN1. Transistor MN1 has a gate connected to the first terminal and a second terminal connected to the low voltage supply Vss. Transistor MN1 thus forms a diode. Transistor MN3 has a first terminal connected to the second terminal of transistor MP5. Transistor MN2 has a first terminal connected to a second terminal of resistor R2 and its gate, and a second terminal connected to Vss. Through the connection relationship, compensation unit 122 generates the control voltage signal VCTRL in response to the PTAT and PTAR currents and provides the control voltage signal VCTRL to oscillator 11.

In accordance with the present invention, input unit 121 may include other circuits in addition to the circuit shown in FIG. 9. Compensation unit 122 may also include other circuits in addition to the circuit shown in FIG. 9, such as circuits of FIGS. 6 to 8 (not including the PTAT current). Furthermore, the control voltage generating circuit 12 as a whole may include other suitable circuits.

Embodiments of the present invention provide an oscillator circuit having a voltage controlled oscillator 11 and a control voltage generating circuit 12. Control voltage generating circuit 12 generates a control voltage that compensates temperature and process variations to reduce or eliminate effects of the process and temperature variations on the output signal frequency. The oscillator circuit according to the present invention has several advantages over prior art structures that require an external calibration, such as an external reference clock and digital control circuitry. The oscillator circuit according to the present invention provides a much simpler design that relies upon current mirrors.

Example Embodiment 1

Figure 10:
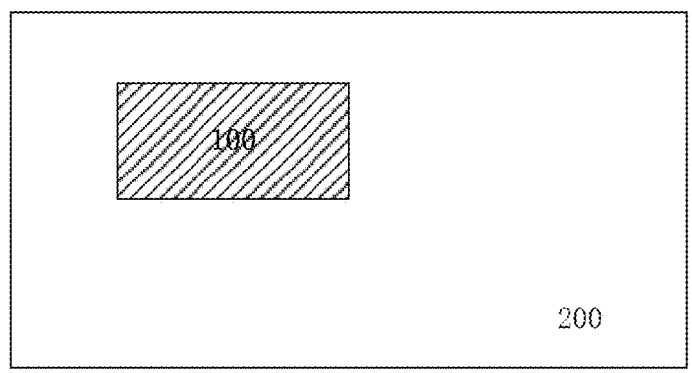
FIG. 10 is a simplified block diagram of an electronic device according an embodiment of the present invention.

Embodiments of the present invention also provide an electronic device 200, as shown in FIG. 10. As shown, electronic device 200 includes an oscillator circuit 100 that can be the above-described oscillator circuit of example embodiment 1.

Electronic device 200 may be a cell phone, a tablet PC, a laptop, a netbook, a game console, a television receiver, a VCD, a DVD, a global positioning system, a digital camera, a voice recorder, a MP3, MP4, PSP and other electronic products, or an intermediate product including an oscillator circuit 100.

As the oscillator circuit of the present invention has a compensation circuit to compensate for temperature and process variations to maintain a stable output signal frequency without resorting to a digital control circuitry and an external clock reference, an electronic device having such an oscillator will benefit from the above-described advantages.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. For example, although a ring oscillator with three delay elements are used, it is understood that the odd number can be more than three in other embodiments. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. An oscillator circuit, comprising:
a voltage-controlled oscillator configured to output an AC output signal having a predetermined frequency which changes due to temperature and process variations; and
a control voltage generating circuit configured to provide a voltage signal to the voltage-controlled oscillator to maintain the predetermined frequency by compensating for the temperature and process variations, the control voltage generating circuit comprising an input unit configured to provide a PTAT (proportional to absolute temperature) current and a PTAR (proportional to absolute resistance) current and a compensation unit configured to generate the voltage signal in response to the PTAT current and the PTAR current, wherein:
the input unit comprises:
a first current mirror circuit for outputting a mirrored PTAT current at a node, the first current mirror circuit comprising a first transistor having a terminal directly connected to a power supply terminal, and a second transistor having a terminal directly connected to the power supply terminal;
a second current mirror circuit for outputting a mirrored PTAR current at the node, the second current mirror comprising a third transistor having a terminal directly connected to the power supply terminal, and a fourth transistor having a terminal directly connected to the power supply terminal; and
the compensation unit comprises:
a third current mirror circuit comprising a fifth transistor having a terminal directly connected to the power supply terminal, and a sixth transistor having a terminal directly connected to the power supply terminal; and
the first, second, third, fourth, fifth, and sixth transistor being all of p-type transistors.

2. The oscillator circuit of claim 1, wherein the node is an output terminal of the input unit configured to output the mirrored PTAT current and the mirrored PTAR current.

3. The oscillator circuit of claim 1, wherein the compensation unit further comprises:
an input terminal connected to the node;
a first resistor having a first terminal and a second terminal, the first terminal being connected to the input terminal; and
a first n-type transistor having a first terminal and a gate connected together to form a diode, the first terminal of the first n-type transistor connected to the second terminal of the first resistor for receiving the mirrored PTAT current and the mirrored PTAR current.

4. The oscillator circuit of claim 1, wherein the voltage-controlled oscillator is a ring oscillator.

5. The oscillator circuit of claim 1, wherein the voltage-controlled oscillator comprises an odd number N of delay elements, N being an integer greater than or equal to three, each of the delay elements comprising an inverter including a p-type transistor and an n-type transistor and a control transistor connected in series, the control transistor having a source connected to a drain of the n-type transistor, a drain connected to a low voltage level Vss, and a gate connected to the voltage signal.

6. The oscillator circuit of claim 5, wherein the control transistor is an n-type transistor.

7. The oscillator circuit of claim 5, wherein the p-type transistor comprises a source connected to the power supply terminal, the inverter of a first delay element comprising an output connect to an input of the inverter of a next delay element, and an output of a last delay element connected to an input of the inverter of the first delay element.

8. The oscillator circuit of claim 7, wherein the output of the last delay element outputs the AC output signal.

9. An electronic device comprising an oscillator circuit, the oscillator circuit comprising:
a voltage-controlled oscillator configured to output an AC output signal having a predetermined frequency which changes due to temperature and process variations; and
a control voltage generating circuit configured to provide a voltage signal to the voltage-controlled oscillator to maintain the predetermined frequency by compensating for the temperature and process variations, the control voltage generating circuit comprising an input unit configured to provide a PTAT (proportional to absolute temperature) current and a PTAR (proportional to absolute resistance) current and a compensation unit configured to generate the voltage signal in response to the PTAT current and the PTAR current, wherein:
the input unit comprises:
a first current mirror circuit for outputting a mirrored PTAT current at a node, the first current mirror circuit comprising a first transistor having a terminal directly connected to a power supply terminal, and a second transistor having a terminal directly connected to the power supply terminal;
a second current mirror circuit for outputting a mirrored PTAR current at the node, the second current mirror comprising a third transistor having a terminal directly connected to the power supply terminal, and a fourth transistor having a terminal directly connected to the power supply terminal; and
the compensation unit comprises:
a third current mirror circuit comprising a fifth transistor having a terminal directly connected to the power supply terminal, and a sixth transistor having a terminal directly connected to the power supply terminal; and
the first, second, third, fourth, fifth, and sixth transistor being all of p-type transistors.

10. The electronic device of claim 9, wherein the node is an output terminal of the input unit configured to output the mirrored PTAT current and the mirrored PTAR current.

11. The electronic device of claim 10, wherein the compensation unit further comprises:
an input terminal connected to the node;
a first resistor having a first terminal and a second terminal, the first terminal being connected to the input terminal; and
a first n-type transistor having a first terminal and a gate connected together to form a diode, the first terminal of the first n-type transistor connected to the second terminal of the first resistor for receiving the mirrored PTAT current and the mirrored PTAR current.

12. The electronic device of claim 9, wherein the voltage-controlled oscillator comprises an odd number N of delay elements, N being an integer greater than or equal to three, each of the delay elements comprising an inverter including a p-type transistor and an n-type transistor and a control transistor connected in series, the control transistor having a source connected to a drain of the n-type transistor, a drain connected to a low voltage level Vss, and a gate connected to the voltage signal.

13. The electronic device of claim 9, wherein the wherein the control transistor is an n-type transistor.

* * * * *